US008445887B2

(12) United States Patent
Yoon et al.

(10) Patent No.: US 8,445,887 B2
(45) Date of Patent: May 21, 2013

(54) NONVOLATILE PROGRAMMABLE SWITCH DEVICE USING PHASE-CHANGE MEMORY DEVICE AND METHOD OF MANUFACTURING THE SAME

(75) Inventors: Sung Min Yoon, Daejeon (KR); Byoung Gon Yu, Daejeon (KR); Soon Won Jung, Daejeon (KR); Seung Yun Lee, Daejeon (KR); Young Sam Park, Daejeon (KR); Joon Suk Lee, Bucheon-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 271 days.

(21) Appl. No.: 12/428,628

(22) Filed: Apr. 23, 2009

(65) Prior Publication Data
US 2010/0108977 A1    May 6, 2010

(30) Foreign Application Priority Data
Oct. 1, 2008   (KR) .................. 10-2008-0096529

(51) Int. Cl.
*H01L 45/00* (2006.01)
(52) U.S. Cl.
USPC ............. 257/4; 257/2; 257/246; 257/E31.029
(58) Field of Classification Search
USPC ................... 257/4, E45.002, 2, 246, E31.029
See application file for complete search history.

(56) References Cited

U.S. PATENT DOCUMENTS 6,356,478 B1   3/2002 McCollum
7,256,130 B2   8/2007 Spandre
2005/0127524 A1   6/2005 Sakamoto et al.
2010/0155685 A1*  6/2010 Hurkx ............................ 257/3

FOREIGN PATENT DOCUMENTS

| JP | 2005-109960 | 4/2005 |
| KR | 1020040085914 A | 10/2004 |
| KR | 100779099 B1 | 11/2007 |
| WO | WO 2009001262 | * 12/2008 |

OTHER PUBLICATIONS

Lankhorst, Martijn H. R., et al; Low-Cost and Nanoscale Non-Volatile Memory Concept for Future Silicon Chips, Mar. 13, 2005, 6 pp.*
Lankhorst et al, "Low-cost and nanoscale non-volatile memory concept for future silicon chips," Apr. 2005, Nature, vol. 4, pp. 347-352.*

(Continued)

*Primary Examiner* — Matthew Reames
*Assistant Examiner* — Benjamin Tzu-Hung Liu

(57) ABSTRACT

A nonvolatile programmable switch device using a phase-change memory device and a method of manufacturing the same are provided. The switch device includes a substrate, a first metal electrode layer disposed on the substrate and including a plurality of terminals, a phase-change material layer disposed on the substrate and having a self-heating channel structure, the phase-change material layer having a plurality of introduction regions electrically contacting the terminals of the first metal electrode layer and a channel region interposed between the introduction regions, an insulating layer disposed on the first metal electrode layer and the phase-change material layer, a via hole disposed on the first metal electrode layer, and a second metal electrode layer disposed to fill the via hole. The switch device performs memory operations using resistive heating of a phase-change material without an additional heater electrode, thereby minimizing thermal loss due to thermal conductivity of a metal electrode to reduce power consumption of the switch device.

7 Claims, 10 Drawing Sheets

OTHER PUBLICATIONS

Kazuya Nakayama et al., "Submicron Nonvolatile Memory Cell Based on Reversible Phase Transition in Chalcogenide Glasses," Japanese Journal of Applied Physics, Nov. 2000, pp. 6157-6161, vol. 39, Part 1, No. 11.

Kazuya Nakayama et al., "Nonvolatile Memory Based on Phase Change in Se-Sb-Te Glass," Japanese Journal of Applied Physics, Feb. 2003, pp. 404-408, vol. 42, Part 1, No. 2.

Sung-Min Yoon et al., "Sb-Se-Based Phase-Change Memory Device With Lower Power and Higher Speed Operations," IEEE Electron Device Letters, Jun. 2006, pp. 445-447, vol. 27, No. 6.

Martijn H. R. Lankhorst et al., "Low-cost and nanoscale non-volatile memory concept for future silicon chips," Nature materials, Apr. 2005, pp. 347-352, vol. 4, Nature Publishing Group.

Heon Lee et al., "Switching Characterization and Failure Analysis of $In_2Se_3$ Based Phase Change Memory," Japanese Journal of Applied Physics, 2005, pp. 4759-4763, vol. 44, No. 7A.

Tae Jin Park et al., "Phase Transition Characteristics and Nonvolatile Memory Device Performance of $Zn_xSb_{100-x}$ Alloys," Japanese Journal of Applied Physics, 2007, pp. L543-L545, vol. 46, No. 23.

Y. C. Chen et al., "Ultra-Thin Phase-Change Bridge Memory Device Using Gesb," IEEE, Dec. 2006, pp. 1-4.

Shunichi Kaeriyama et al., "A Nonvolatile Programmable Solid-Electrolyte Nanometer Switch," IEEE Journal of Solid-State Circuits, Jan. 2005, pp. 168-176, vol. 40, No. 1.

Hiromitsu Kimura et al., "Complementary Ferroelectric-Capacitor Logic for Low-Power Logic-in-Memory VLSI," IEEE Journal of Solid-State Circuits, Jun. 2004, pp. 919-926, vol. 39, No. 6.

Shoichi Masui et al., "A Ferroelectric Memory-Based Secure Dynamically Programmable Gate Array," IEEE Journal of Solid-State Circuits, May 2003, pp. 715-725, vol. 38, No. 5.

* cited by examiner

NONVOLATILE PROGRAMMABLE SWITCH DEVICE USING PHASE-CHANGE MEMORY DEVICE AND METHOD OF MANUFACTURING THE SAME

CROSS-REFERENCE TO RELATED APPLICATION

This application claims priority to and the benefit of Korean Patent Application No. 10-2008-0096529, filed Oct. 1, 2008, the disclosure of which is incorporated herein by reference in its entirety.

BACKGROUND

1. Field of the Invention

The present invention relates to a programmable switch device, and more specifically, to a nonvolatile programmable switch device using a phase-change random access memory device (PRAM) and a method of manufacturing the same.

2. Discussion of Related Art

Recent trends in technical developments of the electronics industry can be summarized as follows:

First, set application devices have become highly functional centering on portable devices and digital household electrical appliances, and digital components for mounting multimedia contents have been developed.

Second, with integration of discrete technical fields, such as broadcasting, communications, and computers, electronic components have shown a growing tendency to shrink to single chips.

Third, owing to consumers' specific and diversified demands, the lifespans of components have become shortened and a wide variety of components have been increasingly produced in small quantities.

The trends in the developments of the electronics industry are being realized by active research on reconfigurable large-scale integrations (LSIs) in which circuits are capable of being partially reconfigured at users' requests to fulfill various functions, instead of manufacturing new semiconductor chips separately to meet various functions and demands.

A field programmable gate array (FPGA), which is a typical conventional reconfigurable LSI, may include a programmable switch matrix for partially reconfiguring an LSI circuit, and a unit switch device constituting the programmable switch matrix may include a static random access memory (SRAM) (or a flip-flop) and a pass-gate. However, the FPGA may have the following problems:

First, since the FPGA occupies a large chip area, its fabrication would be costly. Second, a high resistance of a transistor switch device as well as an increase in a parasitic element due to an increase in the length of interconnection lines caused by the large chip area may lead to a reduction in operating speed. Third, the area of the switch matrix is much larger than that of a logic LSI circuit and thus configuration of the logic LSI circuit may be inefficient and its parallel computing capability may be degraded. Fourth, since a switch uses a volatile memory, it is highly likely to lose data during power interruption. As a result, the logic LSI circuit requires an additional external memory.

In order to solve the above-described problems, it is necessary to develop a new programmable switch device.

A switch device for a reconfigurable LSI requires the following important capabilities:

First, the switch device should have the lowest possible on-state resistance. A high on-state resistance of the switch device may bring about a considerable voltage drop in each switch device during the drive of a switch matrix, thereby hindering the drive of the entire matrix. In addition, a marked signal delay may occur due to the high on-state resistance of the switch device. Although a conventional switch device composed of an SRAM and a pass-gate has an on-state resistance of several kΩ or less, it is necessary to reduce the on-state resistance of the switch device by about one tenth.

Second, the switch device should have a small cell area. As stated above, a conventional reconfigurable LSI includes a switch matrix with a much larger area than that of a logic circuit, thereby greatly lowering configuration efficiency of the entire LSI. In this case, the introduction of a new small-sized switch device may lead not only to a reduction in the cell area of the switch device but also to an increase in an area occupied by a logic circuit in the entire reconfigurable LSI, thereby improving the performance of the entire LSI. In other words, a reduction in a distance between logic circuit regions may result in the reduction of a parasitic element caused in interconnections, thereby lessening the operation delay time of the entire LSI.

Third, the switch device should have nonvolatile characteristics. Since a conventional switch device comprised of an SRAM and a pass-gate loses stored data during power interruption, an additional nonvolatile memory should be installed outside an LSI in order to prevent data loss. However, this may lead to the following two problems: First, the installation of the additional nonvolatile memory outside the LSI may cause an increase in the area of the entire LSI and a rise in an operating voltage. Second, since the external nonvolatile memory is highly likely to lose data through illegal access, the security of a reconfigurable LSI mainly used during development of new products may greatly deteriorate. Therefore, a switch matrix including a nonvolatile switch device may be embedded in a reconfigurable LSI.

Fourth, the switch device should be capable of operating at a low voltage. In recent years, reconfigurable LSIs including nonvolatile switch matrixes using flash memories as switch devices have been introduced. However, the reconfigurable LSIs require additional internal voltage boost circuits because the flash memories basically operate at high voltages. Accordingly, it is necessary to develop a low-voltage nonvolatile programmable switch device.

Fifth, the switch device should have sufficient reliability against repeated write operations. Although a conventional switch device composed of an SRAM and a pass-gate has no restrictions on repeated write operations, nonvolatile memory operations cannot be expected from the conventional switch device because the switch device is originally a volatile device. Also, the number of times the above-described flash-memory switch device is capable of repeating a write operation is limited to $10^5$ times. Accordingly, it is necessary to introduce a new switch device with better repeated write characteristics.

Sixth, a nonvolatile programmable switch device should be capable of retaining stored data for a long time. In other words, the nonvolatile programmable switch device should have long-term data retention. In general, a memory device requires a data retention characteristic, which determines the operating reliability of a nonvolatile memory device. Even a nonvolatile programmable switch device mounted on a reconfigurable LSI should have data retention. Unlike a typical memory device, since the nonvolatile programmable switch device is mounted in an LSI circuit, it is mostly employed with application of a voltage bias under certain conditions. Accordingly, the switch device for the reconfigurable LSI requires high data retention so that stored data can be stably retained even with application of a bias under actual conditions.

One of the strongest candidates for a technique capable of embodying a nonvolatile programmable nano-switch device for a reconfigurable LSI that solves the above-described technical problems is to adopt a nonvolatile phase-change random access memory device (PRAM) as a switch device.

The PRAM is fabricated using a phase-change material whose resistance varies according to its crystalline phase. In order to enable a memory operation, the PRAM controls the crystalline state of the phase-change material with application of current or voltage under appropriate conditions to store data, and determines the kind of the stored data based on a variation in resistance according to the crystalline state of the phase-change material. The phase-change material has a low resistance in a crystalline phase and a high resistance in an amorphous phase. By use of the above-described characteristics, the PRAM may not only function as a nonvolatile memory but also be effectively switched between low and high resistance states.

Meanwhile, a chalcogenide metal alloy, particularly, $Ge_2Sb_2Te_5$ (GST)—obtained by combining germanium(Ge), antimony(Sb), and tellurium(Te) with a composition ratio of 2:2:5—has been employed as a phase-change material layer of a PRAM. Since the GST has been widely used as an essential material for an optical storage medium using phase change due to laser beams, its physical properties are well known. Above all, the GST with a composition ratio of 2:2:5 is widely used for optical storage media because it can be reversibly switched between an amorphous phase and a crystalline phase and crystallized quickly and is highly capable of continuously changing its phase. These characteristics are still advantageous in application to phase-change semiconductor memory devices. Accordingly, it is understood that the GST with the above-described composition may be easily applied to PRAMs and actually used for most practically useful PRAMs.

Also, since a manufacturing process of PRAMs is highly compatible with conventional processes of manufacturing silicon-based devices, the PRAMs can be as highly integrated as DRAMs. By comparison, in the case of magneto-resistive random access memories (MRAMs) and ferroelectric random access memories (FRAMs) that compete with the PRAMs, with the miniaturization of devices, the difficulty of processes may sharply increase and the performance of the devices may deteriorate. Accordingly, judging from the present state of technical developments, a PRAM is the strongest candidate for an advanced nonvolatile memory that can replace conventional flash memories and has attracted much attention for that reason.

When the above-described PRAM is used as a nonvolatile programmable switch device, the following technical merits can be obtained:

First, a PRAM has an on-state resistance of several hundred Ω, which is only a tenth of that of a conventional switch device comprised of an SRAM and a pass-gate.

Second, on the basis of the minimum circuit design unit F that is mainly used to indicate the area of a device, since the cell area of a switch device including a PRAM is 8F2 or less, and that of a conventional switch device comprised of an SRAM and a pass-gate is 120F2, the cell area can be reduced to $1/15$ that of the conventional switch device.

Third, as mentioned above, a PRAM may function as a nonvolatile memory and be embedded in a switch matrix for a reconfigurable LSI so that an additional external read-only memory (ROM) is not required.

Fourth, when a PRAM is installed in a switch matrix for a reconfigurable LSI, a switch device can operate at a low voltage so that it does not require a voltage boost circuit as does a nonvolatile FPGA and can have better repeated write characteristics than a flash memory.

Fifth, considering its operating principles, a PRAM may easily control a threshold voltage required for an operation according to the kind of a material and the structure of the device so that it can easily retain stored data even with long-term application of a specific bias voltage.

However, in order to obtain the above-described merits, solutions to the following technical issues need to be furnished:

First, power consumption required for driving a programmable switch device including a PRAM should be further reduced.

When a nonvolatile programmable switch includes a PRAM, the PRAM is introduced in an LSI circuit having a common CMOS device. In this case, it is necessary to reduce the operating current of the PRAM in order to normally operate the PRAM.

Second, it is necessary to ensure compatibility and process simplicity when a programmable switch device having a PRAM is integrated with an LSI.

Third, the operating reliability of a programmable switch device including a PRAM needs to be ensured.

When a nonvolatile programmable switch device employs a PRAM, the operating reliability of the PRAM as a memory device and the operating reliability of the programmable switch device in logic and system LSIs should be considered simultaneously. This makes a big difference from a case in which the PRAM serves only as a memory device. Accordingly, in order to solve this technical issue, it is very important to understand the necessity of a PRAM with a new structure. In general, the operating reliability of the PRAM should satisfy the following two operating conditions:

First, even if a PRAM repeats a write operation, data should be stably stored. In other words, the PRAM must have repeated write characteristics so that it can repeat set and reset operations to erase stored data and rewrite new data. Although the number of times a PRAM is capable of repeating a write operation is known to be about $10^8$ times, this is optimum data obtained using a test device fabricated under the optimum conditions. Considering deviation in the characteristics of individual memory devices constituting an actual memory array, the number of times a PRAM is actually capable of repeating a write operation is estimated to be about $10^5$ to $10^7$ times. Meanwhile, when a nonvolatile programmable switch device includes a PRAM, a required number of times the PRAM is capable of repeating a write operation may depend on the purpose of the programmable switch device.

Second, after data is written in a PRAM, it should be retained as is over time in the operating environment of the PRAM. In other words, set or reset data written in the PRAM should be maintained for a long period of time, even in the high-temperature conditions under which a chip including a memory array actually operates. When discussing nonvolatile memory characteristics, this requirement is mainly considered as a data retention characteristic. Meanwhile, in the case of a PRAM, the crystalline state of a predetermined phase-change material is changed due to thermal energy applied thereto and thus, the PRAM uses a variation in an electrical resistance of the material due to the change in the crystalline state of the material. Therefore, it is necessary to improve the kind of phase-change material and the structure of a PRAM in order to increase the data retention of the PRAM.

A switch device is highly likely to frequently lose stored data during the transition from a high-resistance state to a low-resistance state. This is because a set operation, which is performed during the transition from the high-resistance state to the low-resistance state, requires a lower operating voltage than a reset operation.

As described above, power consumption required for operating a programmable switch device including a PRAM should be further reduced. However, when a PRAM is used as a nonvolatile programmable switch device, a reduction in the power consumption required for a program operation of the PRAM means that data stored in the switch device can be lost more easily due to electrical signals applied to both terminals of the switch device in an LSI circuit. Thus, there is a trade-off relationship between a reduction in the operating current of a programmable switch device and an increase in operating reliability against a voltage bias stress at both terminals of the switch device. Accordingly, it is very difficult to achieve both objects using a conventional two-terminal device structure. This is an essential technical issue to face when a nonvolatile programmable switch device is embodied using a PRAM.

In order to embody a compact, high-performance, high-reliability nonvolatile programmable switch device for a reconfigurable LSI or a system LSI, it is necessary to utilize the merits of a nonvolatile programmable switch device using a PRAM and effectively overcome conventional technical problems based on the above discussions. Therefore, the structure and manufacture of the nonvolatile programmable switch device should satisfy the following two necessary and sufficient conditions:

First, an operating region of a PRAM functioning as a nonvolatile programmable switch device should be shrunk to the nanometer scale, which is compatible with conventional scaling rules, while simplifying the structure of the PRAM and minimizing the introduction of additional processes. According to methods of scaling a PRAM or methods of simply reducing a contact region between a phase-change material and an electrode material, which have been proposed so far in most preceding research, very complicated processes should be added. This increases production costs and a deviation in device characteristics and hinders a process of compatibly integrating a common CMOS transistor of a reconfigurable LSI or a system LSI with its related devices. As a result, in order to satisfy the first condition, it is most desirable to provide a device with the simplest structure that contributes effectually toward reducing an operating current and increasing operating reliability. Accordingly, a nonvolatile programmable switch device needs to have a self-heating channel region formed of a phase-change material without using a contact region between an operating region formed of a phase-change material and an electrode material.

Second, for a nonvolatile programmable switch device using a PRAM, it is difficult to reduce an operating current and simultaneously, increase operating reliability. This is largely due to the fact that the PRAM includes two terminals. That is, when a conventional transistor is used as a switch, the amount of current flowing between a source and a drain may be controlled by adjusting a voltage signal applied to a gate terminal. However, since a two-terminal PRAM uses the same terminal to write predetermined data and read stored data, when the PRAM is used as a nonvolatile programmable switch device, it should still use the same terminals even when the two terminals are connected to other devices constituting a reconfigurable LSI or a system LSI. This two-terminal device structure cannot ensure low power consumption and high operating reliability for a nonvolatile programmable switch device used in a reconfigurable LSI or a system LSI. Of course, it would be possible to partially solve the technical issues by specially improving a phase-change material or an operation mode of a switch device. However, this increases the burden of technical developments because these techniques are not yet developed. Even if the techniques are developed, it is fundamentally difficult to completely solve the technical issues related to power consumption and operating reliability. In conclusion, it is necessary to introduce a four-terminal nonvolatile programmable switch device capable of separating a write operation from a read operation instead of a conventional two-terminal PRAM.

SUMMARY OF THE INVENTION

The present invention is directed to a four-terminal nonvolatile programmable switch device using a phase-change memory device, which is capable of reducing power consumption, reducing a memory cell size, and ensuring reliability of a memory operation in order to make the phase-change memory device commercially accessible, and a method of manufacturing the switch device.

One aspect of the present invention provides a nonvolatile programmable switch device using a phase-change memory device. The switch device includes: a substrate; a first metal electrode layer disposed on the substrate and including a plurality of terminals; a phase-change material layer disposed on the substrate and having a self-heating channel structure, the phase-change material layer having a plurality of introduction regions electrically contacting the terminals of the first metal electrode layer and a channel region interposed between the introduction regions; an insulating layer disposed on the first metal electrode layer and the phase-change material layer; a via hole disposed on the first metal electrode layer; and a second metal electrode layer disposed to fill the via hole. In this case, the channel region of the phase-change material layer includes: a first pattern; and a second pattern having a greater length than the first pattern and crossing the first pattern.

The area of the channel region of the phase-change material layer may be smaller than that of each of the introduction regions.

An area ratio of the introduction regions to the channel region may be 10 or more.

The first metal electrode layer may include: a pair of write terminals connected by the first pattern and operating during a write operation; and a pair of read terminals connected by the second pattern and operating during a read operation.

The phase-change material layer may be formed of a germanium(Ge)-antimony(Sb)-tellurium(Te) alloy ($Ge_2Sb_{2+x}Te_5$), and the amount x of excess of Sb added to the $Ge_2Sb_{2+x}Te_5$ may range from 0.12 to 0.32.

Another aspect of the present invention provides a method of manufacturing a nonvolatile programmable switch device using a phase-change material layer. The method includes: forming a first metal electrode layer on a substrate and patterning the first metal electrode layer to form a plurality of first metal electrode patterns; depositing a phase-change material layer on the substrate; patterning the phase-change material layer to form a plurality of introduction regions electrically contacting the first metal electrode patterns and a channel region interposed between the introduction regions; forming an insulating layer on the first metal electrode layer and the phase-change material layer; forming a via hole on the first metal electrode layer; and forming a second metal electrode layer to fill the via hole. The patterning of the phase-change material layer to form the channel region may include forming the channel region to have a first pattern and a second pattern having a greater length than and crossing the first pattern.

The phase-change material layer may be formed such that the channel region has a smaller area than each of the introduction regions.

The patterning of the phase-change material layer may include: forming a hard mask pattern on the phase-change material layer; etching the phase-change material layer by a helicon plasma dry etch apparatus using a mixture gas of argon (Ar) and carbon tetrafluoride ($CF_4$); and removing the hard mask pattern.

The etching of the phase-change material layer may be performed under a condition where a ratio of $CF_4$ gas to the mixture gas of Ar and $CF_4$ is 10 to 60%.

The forming of the hard mask pattern on the phase-change material layer may include: forming a titanium nitride hard mask layer on the phase-change material layer; forming a photoresist pattern on the titanium nitride hard mask layer; and etching the titanium nitride hard mask layer by a helicon plasma dry etch apparatus using a mixture gas of Ar and $Cl_2$.

The etching of the titanium nitride hard mask layer may be performed under a condition where a ratio of $Cl_2$ gas to the mixture gas of Ar and $Cl_2$ is 10 to 60%.

The removing of the hard mask pattern may be performed by a helicon plasma dry etch apparatus using a mixture gas of Ar and $C_2$ under a condition where a ratio of $Cl_2$ gas to the mixture gas of Ar and $Cl_2$ is 10 to 60%.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

Figure 1A:
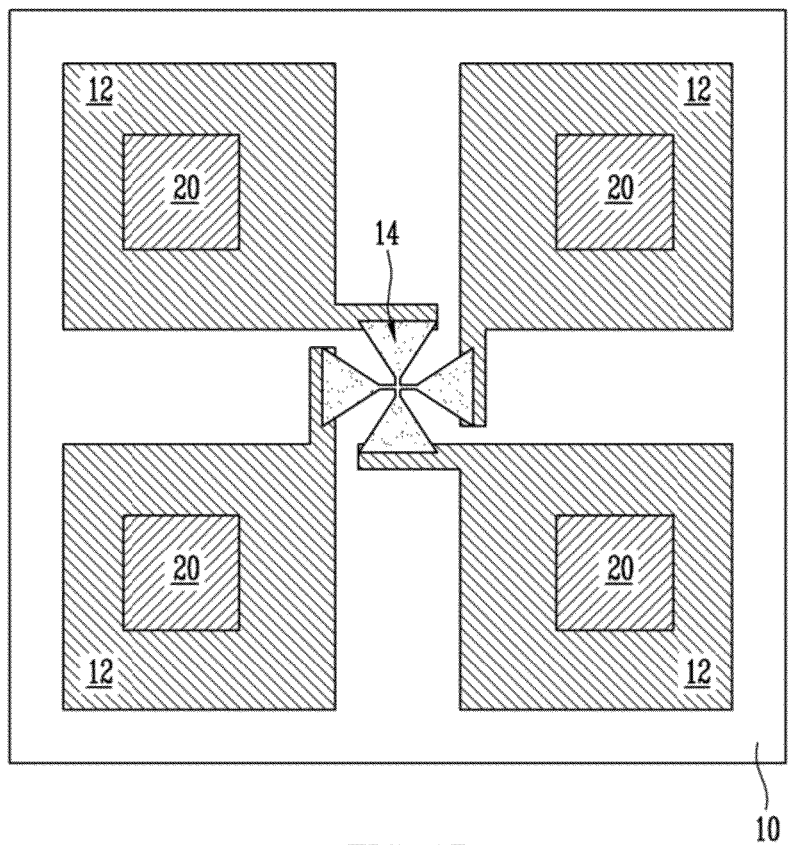
FIG. 1A is a plan view of a nonvolatile programmable switch device using a phase-change random access memory device (PRAM) according to an exemplary embodiment of the present invention.

The present invention will be described more fully hereinafter with reference to the accompanying drawings, in which exemplary embodiments of the invention are shown. This invention may, however, be embodied in different forms and should not be construed as limited to the embodiments set forth herein. In the drawings, portions irrelevant to a description of the present invention are omitted for clarity, and like reference numerals denote like elements.

Throughout the specification, it will be understood that when a portion "includes" an element, it is not intended to exclude other elements but can further include other elements.

Figure 1B:
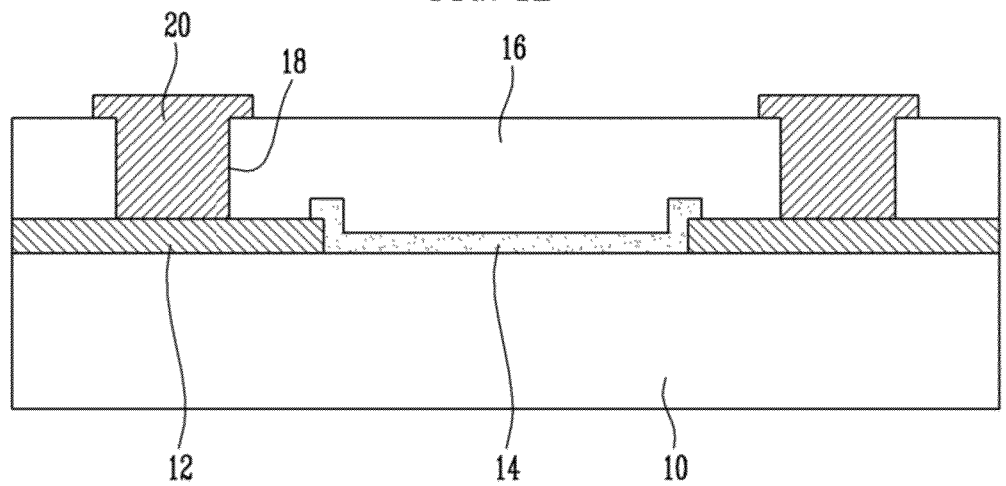
FIG. 1B is a cross-sectional view of the nonvolatile programmable switch device shown in FIG. 1A.

FIG. 1A is a plan view of a nonvolatile programmable switch device using a phase-change random access memory device (PRAM) according to an exemplary embodiment of the present invention, and FIG. 1B is a cross-sectional view of the nonvolatile programmable switch device shown in FIG. 1A.

Referring to FIGS. 1A and 1B, the nonvolatile programmable switch device using the PRAM according to the exemplary embodiment of the present invention may include a substrate 10, four first metal electrode layers 12 disposed on the substrate 10, a phase-change material layer 14 interposed among the four first metal electrode layers 12, an insulating layer 16 disposed on the first metal electrode layers 12 and the phase-change material layer 14, and second metal electrode layers 20 filling via holes 18 formed on the first metal electrode layers 12.

The substrate 10 may be, for example, a silicon substrate or a silicon oxide substrate formed by thermally oxidizing the surface of the silicon substrate.

The first metal electrode layers 12 disposed on the substrate 10 may function as four terminals of a four-terminal nonvolatile programmable switch device according to the present invention. The first metal electrode layers 12 may be formed of a low-resistance metal electrode material, for example, platinum (Pt), tungsten (W), or a titanium-tungsten alloy (TiW) using an ordinary method for forming a metal electrode, for example, a sputtering process or an electronic beam (e-beam) evaporation process. The first metal electrode layers 12 may be formed to a thickness sufficient for a low-resistance characteristic. Since the nonvolatile programmable switch device according to the present invention employs the PRAM, the first metal electrode layers 12 may not be formed to an excessively great thickness such that the subsequently formed phase-change material layer 14 is not cut at sidewalls of the first metal electrode layers 12. The completed first metal electrode layers 12 may have four patterned regions to function as four terminals for transmitting electrical signals to the four-terminal nonvolatile programmable device according to the present invention.

The phase-change material layer 14 may be disposed on the patterned top surfaces of the first metal electrode layers 12 and the substrate 10. The phase-change material layer 14 may serve as a programming region of the nonvolatile programmable switch device according to the present invention. The phase-change material layer 14 may be formed of an alloy of chalcogenide metal elements. The phase-change material layer 14 may have various phase-change characteristics according to the kind and composition of elements of the alloy, and its phase-change characteristics may greatly affect the operation of the PRAM. The chalcogenide metal elements constituting the phase-change material layer 14 may be, for example, Ge, Se, Sb, Te, Sn, or As. That is, a chalcogenide phase-change material is formed by an appropriate combination of Ge, Se, Sb, Te, Sn, and/or As. Also, in order to improve the characteristics of the phase-change material layer 14, elements, such as Ag, In, Bi, and Pb, may be mixed with a combination of chalcogenide metal elements. The phase-change material layer 14 may be formed of $Ge_2Sb_2Te_5$ (GST) obtained by combining Ge, Sb, and Te in a composition ratio of 2:2:5. In addition to GST, the phase-change material layer 14 may be formed of an As—Sb—Te—based chalcogenide alloy (refer to K. Nakayama et al., Jpn, J. Appl. Phys., Vol. 39, pp. 6157-6161, 2000) or an Se—Sb—Te-based chalcogenide alloy (refer to K. Nakayama et al., Jpn, J. Appl. Phys., Vol. 42, pp. 404-408, 2003). In addition to ternary chalcogenide materials, the phase-change material layer 14 according to the present invention may be formed of a binary chalcogenide material. A binary chalcogenide material according to the present invention may be, for example, an Sb—Se-based chalcogenide alloy (refer to S. M. Yoon et al. IEEE Electr. Dev. Lett., vol. 27, pp. 445-447, 2006)., an Sb—Te-based chalcogenide alloy (refer to M. H. R. Lankhorst, Nature Materials, vol. 4, pp. 347-352, or an In—Se-based chalcogenide alloy (refer to H. Lee et al., Jpn, J. Appl. Phys., vol. 44, pp. 4759-4763, 2005). Furthermore, the phase-change material layer 14 according to the present invention may be formed of a non-chalcogenide alloy with phase-change characteristics, for example, a Zn—Sb-based metal alloy-glass (refer to T. J. Park et al., Jpn, J. Appl. Phys., Vol. 46, pp. L543-545, 2007).

The phase-change material layer 14 may be formed using, for example, a sputtering process, an e-beam evaporation process, or a metal organic chemical vapor deposition (MOCVD) process. The phase-change material layer 14 may be patterned using a predetermined etching process to include portions of the first metal electrode layers 12 and a portion of the substrate 10 in a predetermined position and connect the patterned four first metal electrode layers 12. The manufacture of the four-terminal nonvolatile programmable switch device according to the present invention may be significantly affected by the thickness, pattern size, and shape of the phase-change material layer 14. The pattern shape of the phase-change material layer 14 will be described later in more detail with reference to FIG. 2.

Meanwhile, optimization of a dry etching process required for patterning the phase-change material layer 14 greatly affects the operating performance of the programmable switch device according to the present invention. Accordingly, a process of patterning the phase-change material layer 14 will be described later in more detail with reference to FIG. 3.

The insulating layer 16 may be disposed on the phase-change material layer 14 and serve as a thermal insulator of the programmable switch device according to the present invention. The insulating layer 16 may be a silicon oxide layer or a silicon nitride layer. However, the present invention is not limited thereto and the insulating layer 16 may be formed of other insulating materials with similar characteristics. For instance, when the insulating layer 16 is a silicon oxide layer, it may be formed using a CVD process at a low temperature in order to prevent oxidation of the phase-change material layer 14 or a variation in the composition thereof during the formation of the insulating layer 16. For example, the insulating layer 16 may be formed of at least one selected from the group consisting of a silicon oxide layer, a silicon nitride (SiN) layer, a silicon insulating layer, and an organic insulating layer that can be formed at a low temperature. Since the heat transfer characteristics of the insulating layer 16 markedly affect the operating characteristics of the programmable switch device according to the present invention, care must be taken in selecting materials constituting the insulating layer 16.

The insulating layer 16 may function to prevent emission of heat generated by the phase-change material layer 14. Accordingly, the insulating layer 16 should have the lowest possible thermal conductivity and excessive stress should be prevented between the insulating layer 16 and the phase-change material layer 14.

During the formation of the insulating layer 16, a device isolation process may be performed. The via holes 18 may be partially formed in regions where the insulating layer 16 overlaps the first metal electrode layers 12 in the direction of vertical sections, and the second metal electrode layers 20 may be formed to fill the via holes 18. The second metal electrode layers 20 may serve as the programmable switch device, a switch array, and interconnection layers required for forming circuits.

Like the first metal electrode layers 12, the second metal electrode layers 20 may be formed of a low-resistance metal. Since the second metal electrode layers 20 may also function as the interconnection layers constituting the entire switch array, they may be obtained using materials and methods for forming interconnection electrodes, which are applicable to ordinary semiconductor processes.

Figure 2A:
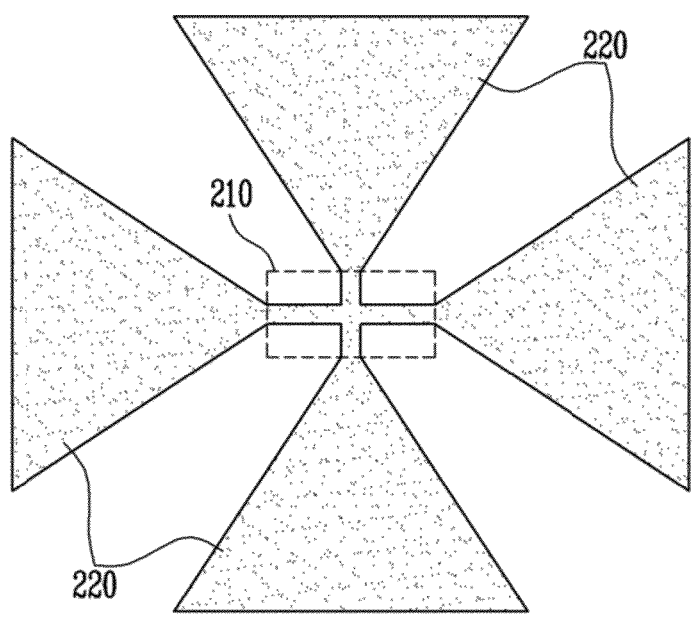
FIG. 2A illustrates an example of a patterned shape of a phase-change material layer included in a nonvolatile programmable switch device using a PRAM according to an exemplary embodiment of the present invention.
Figure 2B:
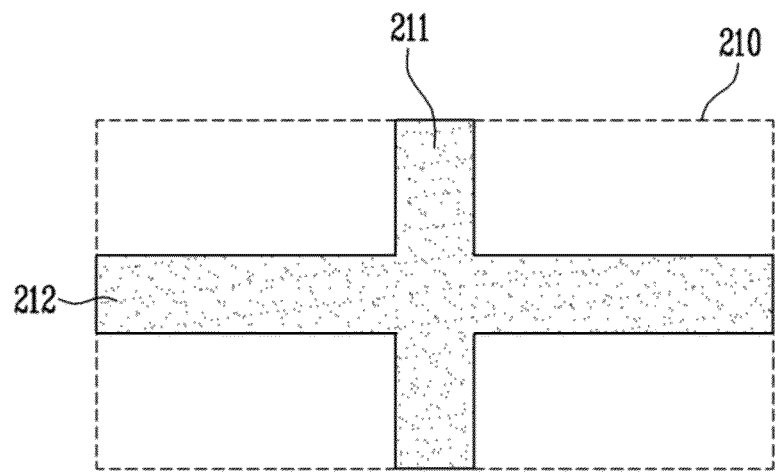
FIG. 2B is an enlarged view of a channel region of the phase-change material layer shown in FIG. 2A.

FIG. 2A illustrates an example of a patterned shape of a phase-change material layer included in a four-terminal nonvolatile programmable switch device using a PRAM according to an exemplary embodiment of the present invention, and FIG. 2B is an enlarged view of a channel region of the phase-change material layer shown in FIG. 2A.

Referring to FIG. 2A, the phase-change material layer of the four-terminal nonvolatile programmable switch device according to the present invention may include a channel region 210 disposed in the center and four introduction regions 220 disposed in the four cardinal directions from the channel region 210 and having a larger area than the channel region 210. In this case, the introduction regions 220 may physically contact and be electrically connected to the first metal electrode layers 12.

Also, the channel region 210 may have a smaller area than each of the introduction regions 220. Thus, the channel region 210 may have a higher resistance than each of the introduction regions 220, and Joule heat generated by current flowing through the phase-change material layer may concentrate into the high-resistance channel region 210. Based on the above-described principles, phase change may be induced due to self-heating of the phase-change material layer without an additional electrode for applying thermal energy to the phase-change material layer so that the PRAM can perform memory operations.

Meanwhile, a heating effect may be enhanced as a ratio of a high-resistance portion to a low-resistance portion increases. Therefore, an area ratio of each of the introduction regions 220 to the channel region 210 needs to be as high as possible without greatly increasing the size of a PRAM. According to an exemplary embodiment, the area ratio of each of the introduction regions 220 to the channel region 210 may be 10 or more. Also, the shape of the introduction regions 220 may be designed to minimize their resistances.

Referring to FIG. 2B, the channel region 210 may include two patterns with different lengths, which cross each other. Also, end portions of the channel region 210 may be respectively connected to the four introduction regions 220. According to an exemplary embodiment, the channel region 210 may have a cross shape.

In this case, the formation of the channel region 210 using two patterns with different lengths is the core of the present invention. The two patterns with different lengths are respectively used in read and write operations of the PRAM. More specifically, in order to enable the write operation, a predetermined electrical signal is applied to a first pattern 211 with a smaller length, and the crystalline state of the phase-change material layer is changed using Joule heat generated due to application of current to store a predetermined data state. In order to enable the read operation, an electrical signal with a lower voltage than the electrical signal applied to the first pattern 211 during the write operation is applied to a second pattern 212 with a greater length to read stored data in the form of a resistance. In other words, a portion of the channel region 210 where the two patterns 211 and 212 with different lengths cross each other may serve as a substantial operating region of the PRAM, whose resistance is read using the second pattern 212 of the channel region 210 to embody a memory operation.

The four-terminal nonvolatile programmable switch device using the PRAM according to the present invention, which is described with reference to FIGS. 1A, 1B, 2A, and 2B, can have the following structural features.

First, the operating region of the phase-change material layer that enables the operation of the PRAM does not contact any electrode layer.

When a heater metal electrode layer (or a lower electrode layer) and an upper electrode layer are disposed under and on the phase-change material layer, Joule heat generated due to an electrical signal applied to enable the operation of the PRAM is lost through the upper and lower metal electrode layers with high thermal conductivities, thereby greatly limiting the amount of Joule heat usable for phase change of the phase-change material layer. As a result, a ratio of Joule heat usable for the phase change of the phase-change material layer to the generated Joule heat is greatly reduced, thereby increasing an operating current of the PRAM. Further, elements of the upper and lower metal electrode layers may diffuse into the phase-change material layer during repeated write operations of the PRAM, thereby degrading the operating reliability of the PRAM.

However, in the case of the four-terminal nonvolatile programmable switch device using the PRAM according to the present invention, since the channel region 210 of the phase-change material layer, which participates in a program operation, does not contact any metal electrode layer, the above-described drawbacks of the conventional PRAM can be avoided.

Second, the phase-change material layer, which enables the operation of the PRAM, may be formed and finely patterned using very simple processes.

That is, the phase-change material layer may be formed using a single thin layer and easily patterned in the shape shown in FIGS. 1A to 2B using predetermined lithography and etching processes, thereby facilitating a reduction in an operating current and an increase in operating reliability. Accordingly, in the case of the four-terminal nonvolatile programmable switch device using the PRAM according to the present invention, it can be understood that the formation of the phase-change material layer using an appropriate etching process by sufficiently utilizing structural characteristics is essential for improving the performance of the PRAM according to the present invention.

A process of forming a fine structure of the phase-change material layer will be described below in detail with reference to FIGS. 3A through 3E.

FIGS. 3A through 3E are cross-sectional views illustrating a process of manufacturing a nonvolatile programmable switch device using a PRAM according to an exemplary embodiment of the present invention.

Figure 3A:
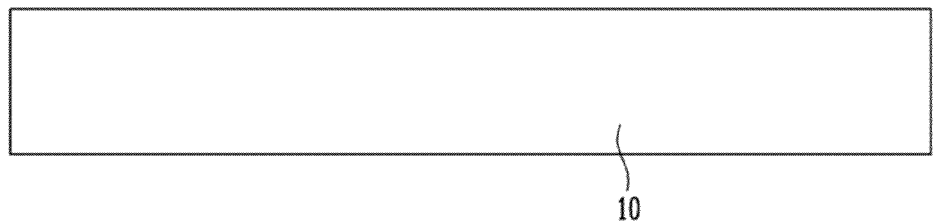
FIGS. 3A through 3E are cross-sectional views illustrating a process of manufacturing a nonvolatile programmable switch device using a PRAM according to an exemplary embodiment of the present invention.

Referring to FIG. 3A, a substrate 10 may be provided. The substrate 10 may be a silicon substrate or a silicon oxide substrate obtained by thermally oxidizing the surface of the silicon substrate.

Figure 3B:
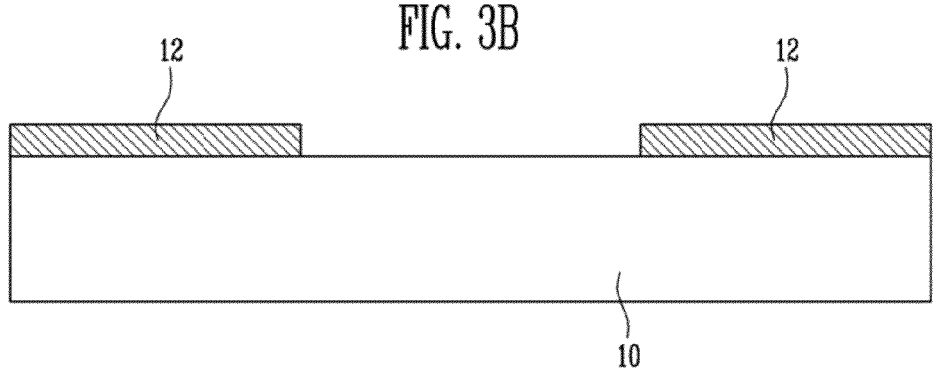

Referring to FIG. 3B, a first metal electrode layer 12 may be deposited on the substrate 10 using a sputtering process or an e-beam evaporation process. In an exemplary embodiment, the first metal electrode layer 12 may be formed of a metal, such as Pt, W, or TiW.

The deposited first metal electrode layer 12 may be patterned using an ordinary metal patterning process including a dry or wet etching process to form four regions.

Figure 3C:
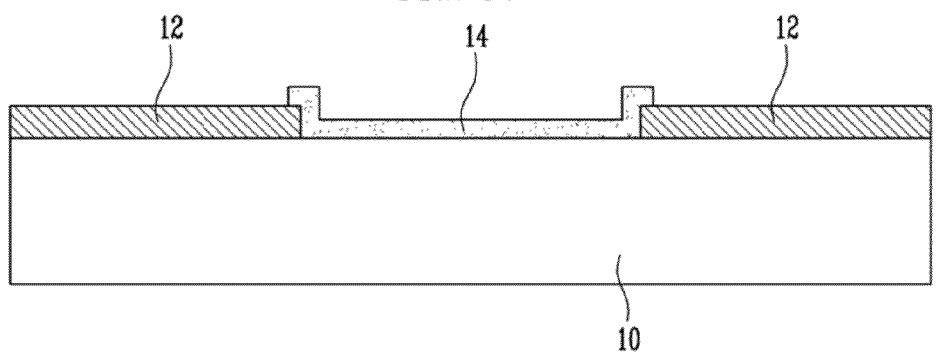

Referring to FIG. 3C, a phase-change material layer 14 may be formed on the substrate 10 to connect the four patterned regions of the first metal electrode layer 12. In order to reinforce its electrical connection with the first metal electrode layer 12, the phase-change material layer 14 may be deposited to partially cover the first metal electrode layer 12. The phase-change material layer 14 may be deposited using a sputtering process, an e-beam evaporation process, or an MOCVD process.

In the manufacture of the nonvolatile programmable switch device using the PRAM according to the present invention, the phase-change material layer 14 may be formed of $Ge_2Sb_{2+x}Te_5$ ($0 \leq x \leq 0.32$) obtained by adding an excess of antimony (Sb) to $Ge_2Sb_2Te_5$ (GST) with a composition ratio of 2:2:5 among germanium (Ge)-antimony (Sb)-tellurium (Te) metal alloys. In particular, the amount "x" of the excess of Sb is significantly considered. More specifically, the amount "x" of the excess of Sb added to the $Ge_2Sb_{2+x}Te_5$ ($0 \leq x \leq 0.32$) phase-change material layer 14 may be controlled to satisfy the following two conditions: First, the phase-change material layer 14 must have a single crystalline structure. Second, the amorphous-phase resistance of the phase-change material layer 14 must be maintained constant for a long time at high temperatures near a crystallization temperature. Furthermore, the amount "x" of the excess of Sb added to the $Ge_2Sb_{2+x}Te_5$ ($0 \leq x \leq 0.32$) phase-change material layer 14 may be controlled not only to satisfy the foregoing two conditions but also not to greatly degrade other characteristics required by a PRAM, specifically, an operating current, an operating speed, and repeated write characteristics.

The amount "x" of the excess of Sb added to the $Ge_2Sb_{2+x}Te_5$ ($0 \leq x \leq 0.32$) phase-change material layer 14 may range from 0.12 to 0.32.

The $Ge_2Sb_{2+x}Te_5$ ($0 \leq x \leq 0.32$) phase-change material layer 14 according to the present invention may be formed using a radio-frequency (RF) magnetron sputtering process.

In this case, a $Ge_2Sb_2Te_5$ target with a composition ratio of 2:2:5 and an Sb target may be used as sputtering targets, and an Sb composition of $Ge_2Sb_{2+x}Te_5$ constituting the phase-change material layer 14 may be changed by modifying sputtering power applied to the Sb target. In an exemplary embodiment of the present invention, a sputtering power of about 100 W may be applied to the $Ge_2Sb_2Te_5$ target.

The deposited phase-change material layer 14 may be patterned using lithography and dry etching processes to have introduction regions and a channel region. In order to operate as a self-heating channel structure, the patterned phase-change material layer 14 may include large-area introduction regions, which are electrically connected to respective electrodes, and a small-area channel region, which is interposed among the introduction regions to enable a phase-change memory operation. Also, the channel region may include two patterns with different lengths, which cross each other. In an exemplary embodiment, the channel region of the phase-change material layer 14 may be formed to a width and length of 500 nm or less.

Since the fine patterning process of the phase-change material layer 14 is the most important process that determines the complexity of the entire manufacturing process and the performance of the PRAM, it will be described later in more detail with reference to FIGS. 4A through 4E.

Figure 3D:
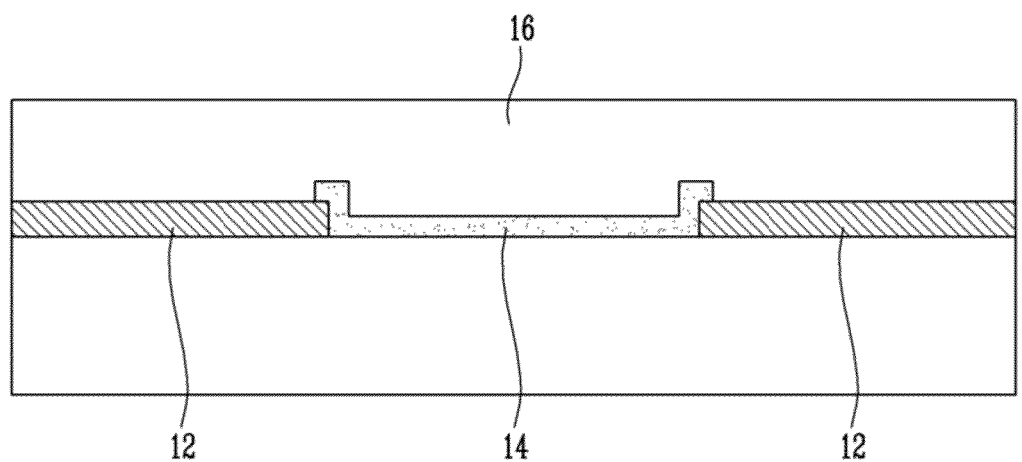

Referring to FIG. 3D, an insulating layer 16 may be formed on the first metal electrode layer 12 and the phase-change material layer 14. In an exemplary embodiment, the insulating layer 16 may be a silicon-based insulating layer, such as a silicon oxide layer or a silicon nitride layer, or an organic insulating layer that can be formed at a low temperature. In order to prevent oxidation or a variation in the composition thereof, the insulating layer 16 may be deposited using a CVD process at a low temperature.

Figure 3E:
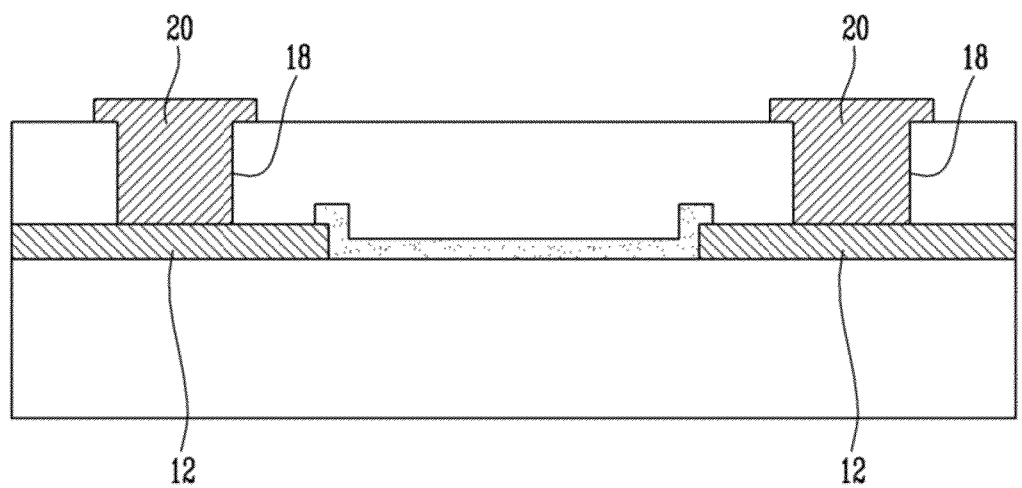

Referring to FIG. 3E, a via hole 18 may be formed on the first metal electrode layer 12, and a second metal electrode layer 20 may be formed to fill the via hole 18.

In an exemplary embodiment, the via hole 18 may be formed using a wet or dry etching process and patterned using an ordinary photolithography process. For example, when the insulating layer 16 is a silicon oxide layer, the via hole 18 may be formed on the first metal electrode layer 12 using an etchant containing fluoric acid (HF).

After the via hole 18 is formed, the second metal electrode layer 20 may be deposited using a sputtering process or an e-beam evaporation process to fill the via hole 18. In an exemplary embodiment, the second metal electrode layer 20 may be formed of a metal, such as Pt, W, or TiW.

A method of forming a fine pattern of a phase-change material layer according to an exemplary embodiment of the present invention will be described below with reference to FIGS. 4A through 4E.

Figure 4A:
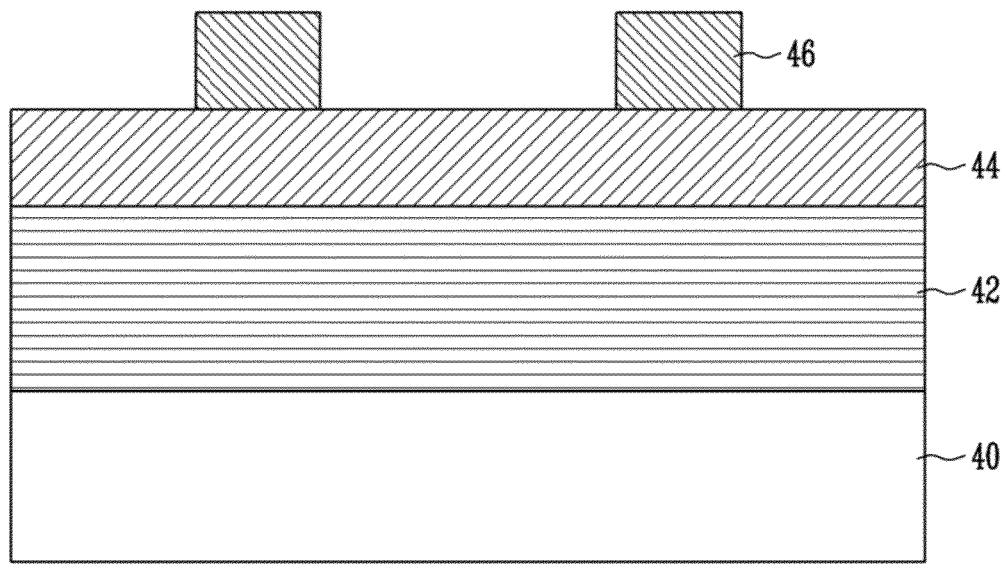
FIGS. 4A through 4D are cross-sectional views illustrating a process of patterning a phase-change material layer in a method of manufacturing a PRAM for a nonvolatile programmable switch device according to an exemplary embodiment of the present invention.
Figure 4B:
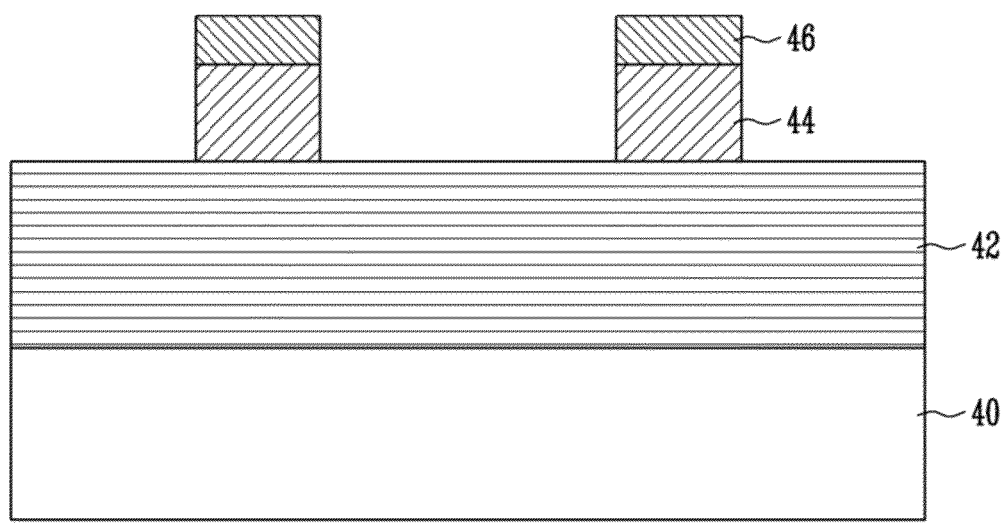
Figure 4C:
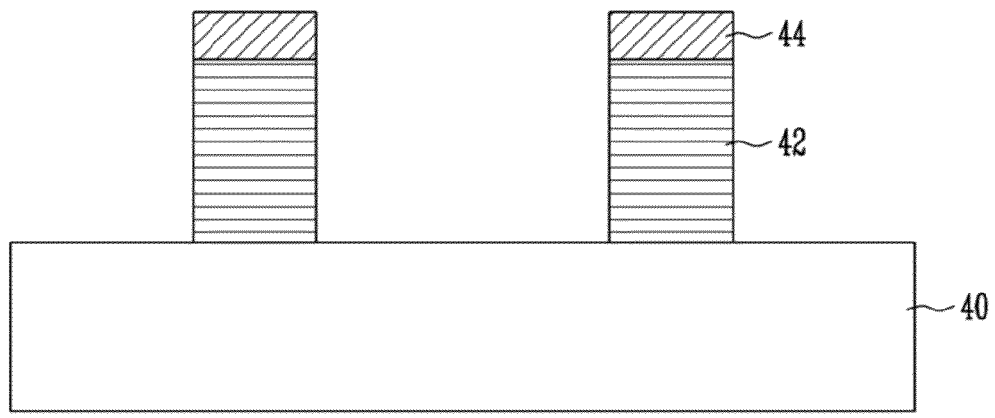
Figure 4D:
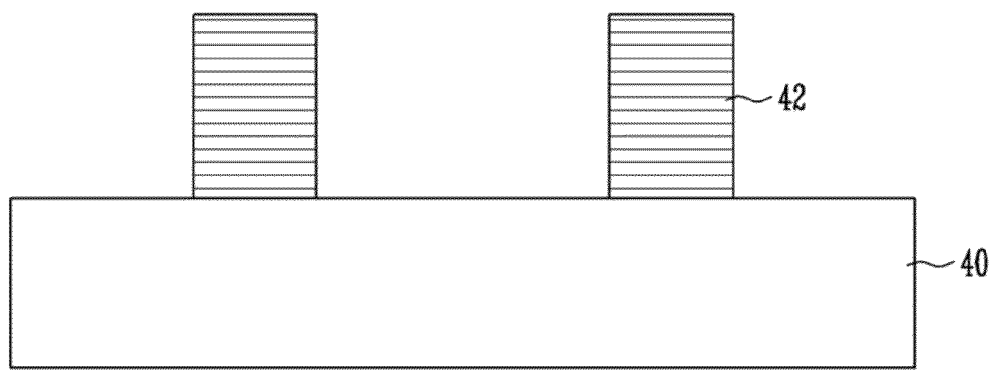
Figure 4E:
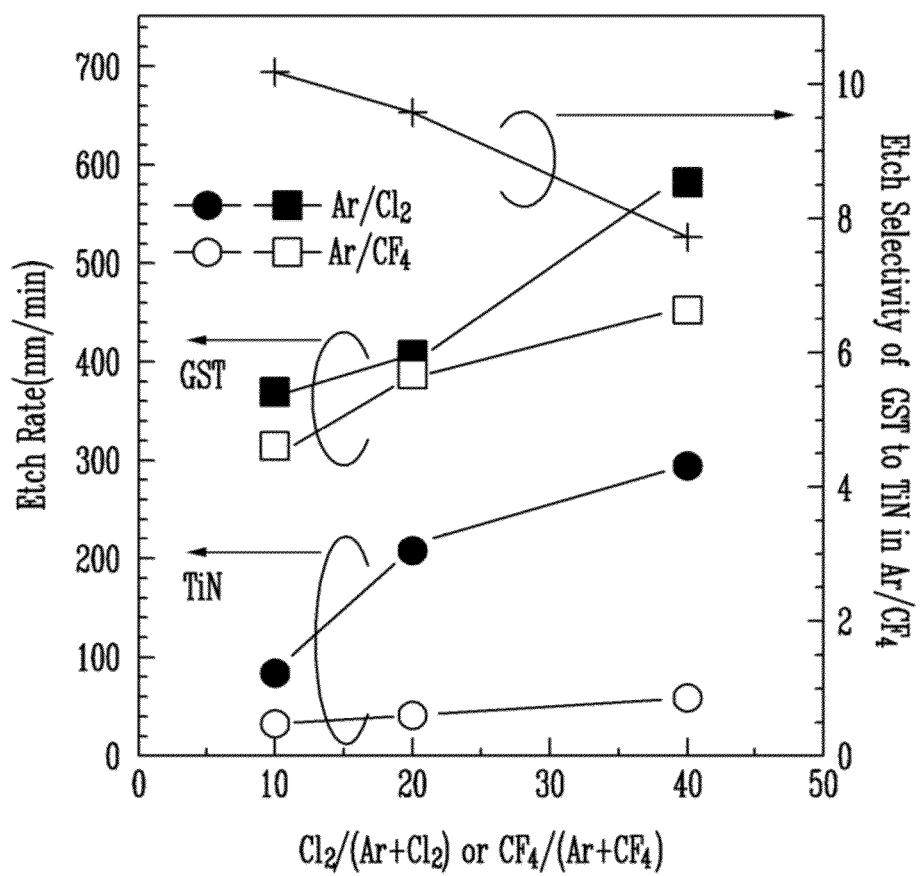
FIG. 4E is a graph showing etch rates and etch selectivities of a $Ge_2Sb_2Te_5$ phase-change material layer and a titanium nitride hard mask layer.

FIGS. 4A through 4D are cross-sectional views illustrating a process of patterning a phase-change material layer in a method of manufacturing a PRAM for a nonvolatile programmable switch device according to an exemplary embodiment of the present invention, and FIG. 4E is a graph showing etch rates and etch selectivities of a $Ge_2Sb_2Te_5$ phase-change material layer and a titanium nitride hard mask layer.

The process of forming the fine pattern of the phase-change material layer according to the exemplary embodiment of the present invention may include forming a phase-change material layer on a substrate 40 using $Ge_2Sb_{2+x}Te_5$ ($0 \leq x \leq 0.32$) on a substrate 40. Thereafter, a hard mask layer required for a dry etching process may be formed of titanium nitride on the $Ge_2Sb_{2+x}Te_5$ ($0 \leq x \leq 0.32$) phase-change material layer. The hard mask layer formed of titanium nitride may be patterned by means of a helicon plasma dry etching apparatus using a mixture gas of argon (Ar) and chloride ($Cl_2$) as an etch gas to form a hard mask pattern. Subsequently, the $Ge_2Sb_{2+x}Te_5$ ($0 \leq x \leq 0.32$) phase-change material layer may be dry etched using a helicon plasma dry etching process using a mixture gas of Ar and carbon tetrafluoride ($CF_4$) as an etch gas, thereby forming a fine pattern of the $Ge_2Sb_{2+x}Te_5$ ($0 \leq x \leq 0.32$) phase-change material layer.

The $Ge_2Sb_{2+x}Te_5$ ($0 \leq x \leq 0.32$) phase-change material layer may be dry etched using the helicon plasma dry etching apparatus under conditions where an RF source power is 500 to 1200 W, an RF bias power is 100 to 600 W, and a process pressure is 3 to 5 mTorr.

The hard mask layer formed of titanium nitride may be dry etched under a condition where a ratio of $Cl_2$ gas to the mixture gas of Ar and $Cl_2$ ($Cl_2/Ar+Cl_2$) is 10 to 60%. Also, the $Ge_2Sb_{2+x}Te_5$ ($0 \leq x \leq 0.32$) phase-change material layer may be dry etched under a condition where a ratio of $CF_4$ gas to the mixture gas of Ar and $CF_4$ ($CF_4/Ar+CF_4$) is 10 to 60%.

In the manufacture of a nonvolatile programmable switch device using a PRAM according to the present invention, the formation of a hyperfine phase-change material layer 42 may include forming a photoresist pattern 46 using a lithography process.

Referring to FIG. 4A, the phase-change material layer 42 may be formed on a substrate 40, and a titanium nitride hard mask layer 44 required for patterning the phase-change material layer 42 may be formed using a direct-current (DC) sputtering process. In an exemplary embodiment, each of the phase-change material layer 42 and the titanium nitride hard mask layer 44 may be formed to a thickness of about 500 Å.

Photoresist may be coated on the titanium nitride hard mask layer 44 and patterned using exposure and developing processes to form the photoresist pattern 46. Although the lithography process may be performed using a lithography apparatus including various light sources, a lithography apparatus using an ArF excimer laser as a light source or an e-beam lithography apparatus may be used to obtain a sub-100-nm fine pattern. For example, the photoresist pattern 46 may be formed using an e-beam lithography apparatus and hydrogen silsesquioxane (HSQ), which is a negative e-beam resist.

After the HSQ photoresist pattern 46 is formed, the titanium nitride hard mask layer 44 may be etched using the HSQ photoresist pattern 46 as a mask.

Referring to FIG. 4B, the titanium nitride hard mask layer 44 may be etched using the photoresist pattern 46 as a mask. In an exemplary embodiment, the titanium nitride hard mask layer 44 may be etched by a dry etching apparatus using a helicon plasma source or etched using a mixture gas of Ar and $Cl_2$ as an etch gas. In this case, the operating frequencies of a source power supply) and a bias power supply may be controlled to be 60 MHz and 13.56 MHz, respectively, a power of 500 to 1200 W, preferably, but not necessarily, 600 W, may be applied to the source power supply, and a power of 100 to 600 W, preferably, but not necessarily, 150 W, may be applied to the bias power supply. Also, a process chamber may be maintained under a pressure of 3 to 5 mTorr, preferably, but not necessarily, 5 mTorr, and a ratio of $Cl_2$ gas to the mixture gas of Ar and $Cl_2$ ($Cl_2/Ar+Cl_2$) may range from 10% to 60%.

In the present exemplary embodiment, the titanium nitride hard mask layer 44 may be etched under a condition where a ratio of $Cl_2$ gas to the mixture gas of Ar and $Cl_2$ ($Cl_2/Ar+Cl_2$) is 20% because this condition is most appropriate for patterning the titanium nitride hard mask layer 44 to form a hard mask pattern 44.

Referring to FIG. 4E, in the above-described etch-gas condition, the titanium nitride hard mask layer 44 was etched at a high etch rate of about 210 nm/min, which facilitates formation of the hard mask pattern 44 with a good shape. Meanwhile, the titanium nitride hard mask layer 44 was etched at a low etch rate of about 80 nm/min under the condition where a ratio of $Cl_2$ gas to the mixture gas of Ar and $Cl_2$ ($Cl_2/Ar+Cl_2$) is 10%. Also, in the condition where a ratio of $Cl_2$ gas to the mixture gas of Ar and $Cl_2$ ($Cl_2/Ar+Cl_2$) is 40%, the titanium nitride hard mask layer 44 was etched at a very high etch rate of about 290 nm/min, but the $Ge_2Sb_{2+x}Te_5$ phase-change material layer 42 was also etched at a very high etch rate of about 580 nm/min. Accordingly, the condition where a ratio of $Cl_2$ gas to the mixture gas of Ar and $Cl_2$ ($Cl_2$/Ar+$Cl_2$) is 20% may be most advantageous in forming the titanium nitride hard mask pattern 44 in consideration of process simplicity and an etch selectivity with respect to the $Ge_2Sb_{2+x}Te_5$ phase-change material layer 42.

Meanwhile, when the titanium nitride hard mask pattern 44 is formed under the above-described etch condition, the HSQ e-beam resist layer formed on the titanium nitride hard mask pattern 44 may be greatly thinned out or completely removed.

After the titanium nitride hard mask layer 44 is etched, the $Ge_2Sb_{2+x}Te_5$ phase-change material layer 42 may be etched using the titanium nitride hard mask pattern 44 formed using the foregoing etch process.

Referring to FIG. 4C, the phase-change material layer 42 may be etched using the titanium nitride hard mask pattern 44. In an exemplary embodiment, the phase-change material layer 42 may be etched by means of a dry etch apparatus using a helicon plasma source or etched using a mixture gas of Ar and $CF_4$ as an etch gas. In this case, the operating frequencies of a source power supply and a bias power supply may be controlled to be 60 MHz and 13.56 MHz, respectively, a power of 500 to 1200 W, preferably, but not necessarily, 600 W, may be applied to the source power supply, and a power of 100 to 600 W, preferably, but not necessarily, 150 W, may be applied to the bias power supply. Also, a process chamber may be maintained under a pressure of 3 to 5 mTorr, preferably, but not necessarily, 5 mTorr, and a ratio of $Cl_2$ gas to the mixture gas of Ar and $Cl_2$ ($Cl_2$/Ar+$Cl_2$) may range from 10% to 60%.

Since the HSQ e-beam resist layer is mostly removed, when the phase-change material layer 42 is etched using a mixture gas of Ar and $Cl_2$, the titanium nitride hard mask pattern 44 with a high etch rate characteristic is etched at the same time, thus degrading the uniformity and soundness of the titanium nitride hard mask pattern 44. In addition, the phase-change material layer 42 is also etched at a very high rate so that a fine pattern of the phase-change material layer 42 cannot be formed to a predetermined size. For this reason, the phase-change material layer 42 may be etched using a mixture gas of Ar and $CF_4$ as an etch gas.

As a result, as shown in FIG. 4E, the use of the titanium nitride hard mask pattern 44 may be a precondition for the use of the mixture etch gas of Ar and $CF_4$ during the etching of the $Ge_2Sb_{2+x}Te_5$ phase-change material layer 42.

In the present embodiment, the $Ge_2Sb_{2+x}Te_5$ ($0 \leq x \leq 0.32$) phase-change material layer 42 may be etched under a condition where a ratio of $CF_4$ gas to the mixture gas of Ar and $CF_4$ ($CF_4$/Ar+$CF_4$) is 20% because this condition is most appropriate for forming the fine pattern of the $Ge_2Sb_{2+x}Te_5$ ($0 \leq x \leq 0.32$) phase-change material layer 42. That is, it is necessary to maintain a high etch selectivity between the titanium nitride hard mask pattern 44 and the $Ge_2Sb_{2+x}Te_5$ ($0 \leq x \leq 0.32$) phase-change material layer 42 during the etch process for forming the fine pattern of the phase-change material layer 42.

Considering an etch selectivity between the titanium nitride hard mask pattern 44 and the $Ge_2Sb_{2+x}Te_5$ ($0 \leq x \leq 0.32$) phase-change material layer 42, an etch rate of the $Ge_2Sb_{2+x}Te_5$ ($0 \leq x \leq 0.32$) phase-change material layer 42, and the etching profile of the $Ge_2Sb_{2+x}Te_5$ ($0 \leq x \leq 0.32$) fine pattern, the condition where a ratio of $Cl_2$ gas to the mixture gas of Ar and $Cl_2$ ($Cl_2$/Ar+$Cl_2$) is 20% may be advantageous in forming the fine pattern of the $Ge_2Sb_{2+x}Te_5$ ($0 \leq x \leq 0.32$) phase-change material layer 42.

Referring to FIG. 4E, when the $Ge_2Sb_{2+x}Te_5$ ($0 \leq x \leq 0.32$) phase-change material layer 42 is etched using a mixture gas of Ar and $CF_4$, the titanium nitride hard mask pattern 44 is hardly etched so that a high etch selectivity between the phase-change material layer 42 and the hard mask pattern 44 can be maintained.

It can be observed that as a ratio of $CF_4$ gas to the mixture gas of Ar and $CF_4$ ($CF_4$/Ar+$CF_4$) reaches 10%, 20%, and 40%, an etch selectivity of a GST thin layer with respect to a titanium nitride layer becomes 10.2, 9.6, and 7.7, respectively. Accordingly, considering only the etch selectivity between the GST phase-change material layer 42 and the titanium nitride hard mask pattern 44, the fine pattern of the phase-change material layer 42 may be formed under a condition where a ratio of $CF_4$ gas to the mixture gas of Ar and $CF_4$ ($CF_4$/Ar+$CF_4$) is 10%.

In contrast, when a ratio of $CF_4$ gas to the mixture gas of Ar and $CF_4$ ($CF_4$/Ar+$CF_4$) is 40% or higher, a sufficiently high etch selectivity between the titanium nitride hard mask pattern 44 and the $Ge_2Sb_{2+x}Te_5$ ($0 \leq x \leq 0.32$) phase-change material layer 42 cannot be obtained, and an unnecessary carbon layer remains on the hard mask pattern 44 due to excessive supply of $CF_4$ so it is likely to degrade the etching profile of the $Ge_2Sb_{2+x}Te_5$ ($0 \leq x \leq 0.32$) fine pattern. Therefore, considering the etch selectivity between the titanium nitride hard mask pattern 44 and the $Ge_2Sb_{2+x}Te_5$ ($0 \leq x \leq 0.32$) phase-change material layer 42, the etch rate of the $Ge_2Sb_{2+x}Te_5$ ($0 \leq x \leq 0.32$) phase-change material layer 42, and the etching profile of the $Ge_2Sb_{2+x}Te_5$ ($0 \leq x \leq 0.32$) fine pattern, the condition where a ratio of $Cl_2$ gas to the mixture gas of Ar and $Cl_2$ ($Cl_2$/Ar+$Cl_2$) is 20% may be most appropriate for forming the fine pattern of the $Ge_2Sb_{2+x}Te_5$ ($0 \leq x \leq 0.32$) phase-change material layer 42.

After the $Ge_2Sb_{2+x}Te_5$ phase-change material layer 42 is etched, the titanium nitride hard mask pattern 44 may be completely removed from the $Ge_2Sb_{2+x}Te_5$ ($0 \leq x \leq 0.32$) fine pattern.

Referring to FIG. 4D, the remaining titanium nitride hard mask pattern 44 may be removed from the patterned phase-change material layer 42. In an exemplary embodiment, the hard mask pattern 44 may be etched by a dry etch apparatus using a helicon plasma source or etched using a mixture gas of Ar and $Cl_2$. In this case, the operating frequencies of the source power supply and the bias power supply may be controlled to be 60 MHz and 13.56 MHz, respectively, a power of 500 to 1200 W, preferably, but not necessarily, 600 W, may be applied to the source power supply, and a power of 100 to 600 W, preferably, but not necessarily, 150 W, may be applied to the bias power supply. Also, a process chamber may be maintained under a pressure of 3 to 5 mTorr, preferably, but not necessarily, 5 mTorr, and a ratio of $Cl_2$ gas to the mixture gas of Ar and $Cl_2$ ($Cl_2$/Ar+$Cl_2$) may range from 10% to 60%.

Referring to FIG. 4E, when a ratio of $Cl_2$ gas to the mixture gas of Ar and $Cl_2$ ($Cl_2$/Ar+$Cl_2$) is 10%, the titanium nitride hard mask pattern 44 may be etched at a low etch rate of about 80 nm/min. However, since the remaining titanium nitride hard mask pattern 44 is sufficiently thin, the titanium nitride hard mask pattern 44 may be etched under the condition where a ratio of $Cl_2$ gas to the mixture gas of Ar and $Cl_2$ ($Cl_2$/Ar+$Cl_2$) is 10% in order to prevent damage to the fine pattern of the phase-change material layer 42.

Figure 5A:
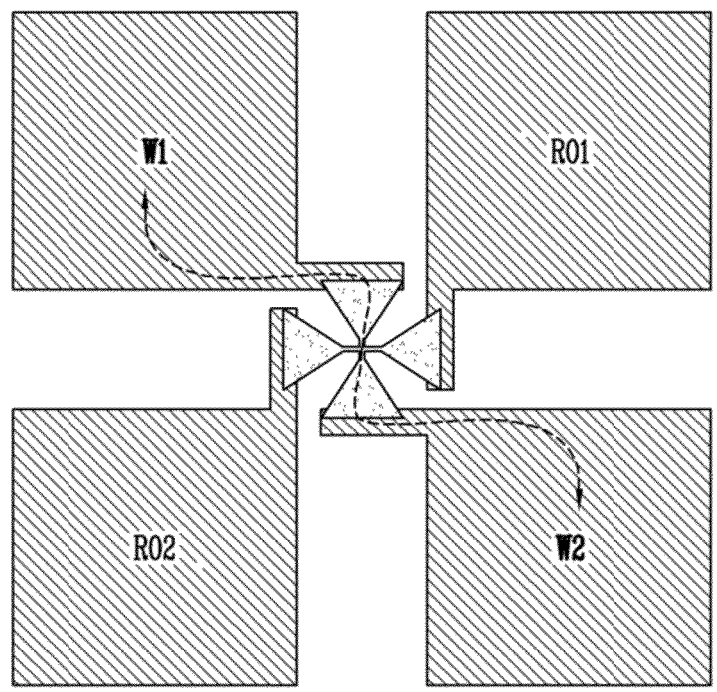
FIGS. 5A and 5B are diagrams for explaining write and read operations, respectively, of a nonvolatile programmable switch device using a PRAM according to an exemplary embodiment of the present invention.
Figure 5B:
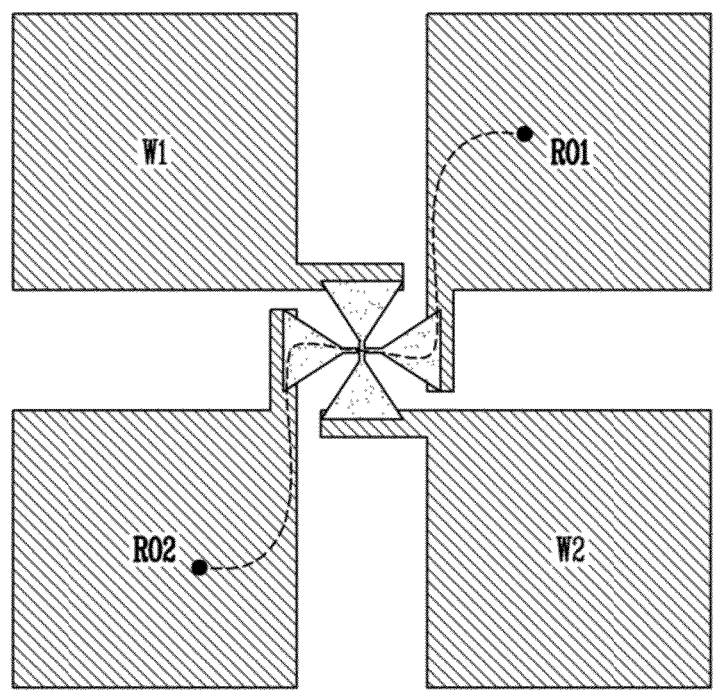

FIGS. 5A and 5B are diagrams for explaining write and read operations, respectively, of a nonvolatile programmable switch device using a PRAM according to an exemplary embodiment of the present invention. In the nonvolatile programmable switch device shown in FIGS. 5A and 5B, the write operation is separated from the read operation.

Referring to FIG. 5A, a write operation for storing predetermined data in the four-terminal PRAM according to the present invention may be performed using two of four terminals W1, W2, RO1, and RO2. In this case, a pair of write terminals W1 and W2 used for the write operation are connected by a first pattern with a smaller length out of two patterns with different lengths, which constitute a channel region of a phase-change material layer.

A voltage applied to the two terminals W1 and W2 used for the write operation may be differently set depending on the kind of a state to be stored, that is, whether a set state or a reset state is to be stored. Also, the write terminals W1 and W2 may be used even when an already stored state is changed to store new data.

In this case, although no voltage signal is typically applied to the remaining terminals RO1 and RO2 that are not used in the write operation, a predetermined voltage signal may be applied to the terminals RO1 and RO2 to increase the controllability of the write operation or control the range of an operating voltage required for the write operation.

Referring to FIG. 5B, a read operation for reading predetermined data stored in the four-terminal PRAM according to the present invention may be performed using two of the four terminals W1, W2, RO1, and RO2. In this case, a pair of read terminals RO1 and RO2 used for the read operation are connected by a second terminal with a greater length out of the two patterns with different lengths, which constitutes the channel region of the phase-change material layer.

A voltage applied to the read terminals RO1 and RO2 used for the read operation may be selected within a range in which it can be determined whether stored data is in a set state or reset state, and set to be lower than a voltage used for the write operation. In this case, since the terminals RO1 and RO2 used for the read operation are electrically connected by the second pattern which is longer than the first pattern, in order to induce phase change of the phase-change material layer and change a data state, a higher voltage than a write voltage applied to the first pattern should be applied through the read terminals RO1 and RO2 to the second pattern. Thus, when a read voltage which is lower than the write voltage is applied to the read terminals RO1 and RO2, change of a previously stored data state due to the application of the read voltage can be prevented, thereby improving the operating reliability of the PRAM.

For the four-terminal nonvolatile programmable switch device using the PRAM, in which the write operation is separated from the read operation, the following three points should be considered to enable appropriate operations:

First, set and reset operating voltages can be controlled by changing the length of the channel region. Accordingly, in the case of the four-terminal programmable switch device including two channel regions with different lengths that cross each other, data may be written using a shorter channel region, while stored data may read using a longer channel region. The nonvolatile programmable switch device according to the present invention is connected to other devices constituting circuits in a reconfigurable LSI or a system LSI. In this case, it is highly likely that an applied voltage signal may have a higher intensity than a low voltage signal applied to read data from a conventional PRAM. When data is read from the programmable switch device according to the present invention with application of a higher read voltage than in the conventional PRAM, damage to previously stored data due to the read voltage should be prevented. Since the four-terminal nonvolatile programmable switch device according to the present invention may change a set operating voltage and a reset operating voltage depending on the length of the channel region, even if a higher read voltage than in the conventional case is applied, it is possible to increase the length of the channel region for a read operation not to rewrite data.

Second, when the four-terminal nonvolatile programmable switch device according to the present invention is used by controlling the length of the channel region, an operating current required for a program operation may be sufficiently reduced to enable a low-power program operation. Simultaneously, since a terminal used for a write operation is completely separated from a terminal connected to other circuit elements in an LSI, the reliability of data stored in the programmable switch device can be increased.

Third, the length of the channel region used for a write operation may be arbitrarily controlled so that a program threshold voltage of the four-terminal nonvolatile programmable switch device according to the present invention can be freely controlled within a specific range. By use of this characteristic, a more functional programmable switch array in which a switch operation may be performed within a wide voltage range by changing program voltages of respective voltages may be embodied according to the application field of the nonvolatile programmable switch device of the present invention.

Meanwhile, although the present invention provides the structure of a four-terminal nonvolatile programmable switch device capable of separating a write operation from a read operation and a method of driving the switch device, the driving method may be changed with application of the same concept. For example, the number of the terminals of the nonvolatile programmable switch device may be reduced to 3. That is, one of two terminals used for each of write and read operations described with reference to FIGS. 5A and 5B may serve as a common ground electrode. In this case, two ground terminals may be replaced by a common ground terminal. Accordingly, the four-terminal nonvolatile programmable switch device may be replaced by a three-terminal nonvolatile programmable switch device according to the construction and application field of a switch array or switch matrix including the nonvolatile programmable switch device.

Figure 6A:
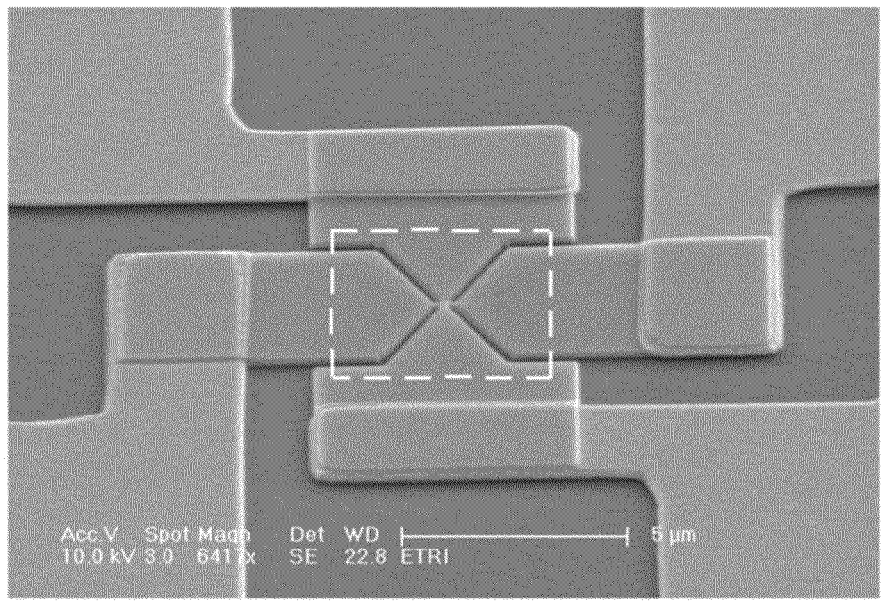
FIGS. 6A and 6B are scanning electron microscope (SEM) images of a nonvolatile programmable switch device using a PRAM according to an exemplary embodiment of the present invention.
Figure 6B:
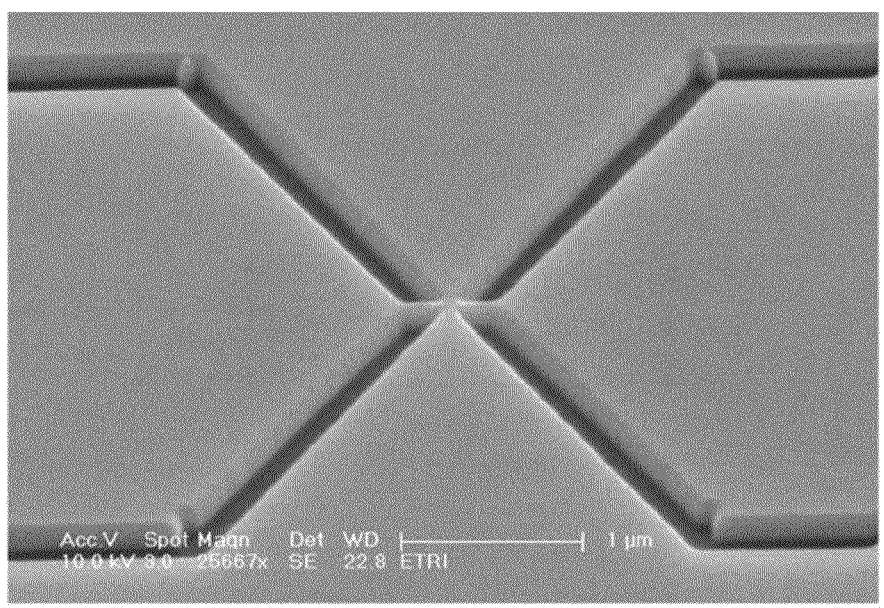

FIGS. 6A and 6B are scanning electron microscope (SEM) images of a four-terminal nonvolatile programmable switch device using a PRAM according to an exemplary embodiment of the present invention. FIG. 6B is an enlarged view of a portion indicated by a dotted rectangle of FIG. 6A.

Referring to FIGS. 6A and 6B, it can be seen that the four-terminal PRAM according to the present invention may be manufactured in good condition by applying the above-described exemplary embodiment. In this case, when patterns constituting a channel region are designed to lengths of 100 nm and 500 nm, respectively, actually formed patterns of the channel region have lengths of about 120 nm and 485 nm, respectively.

Figure 7:
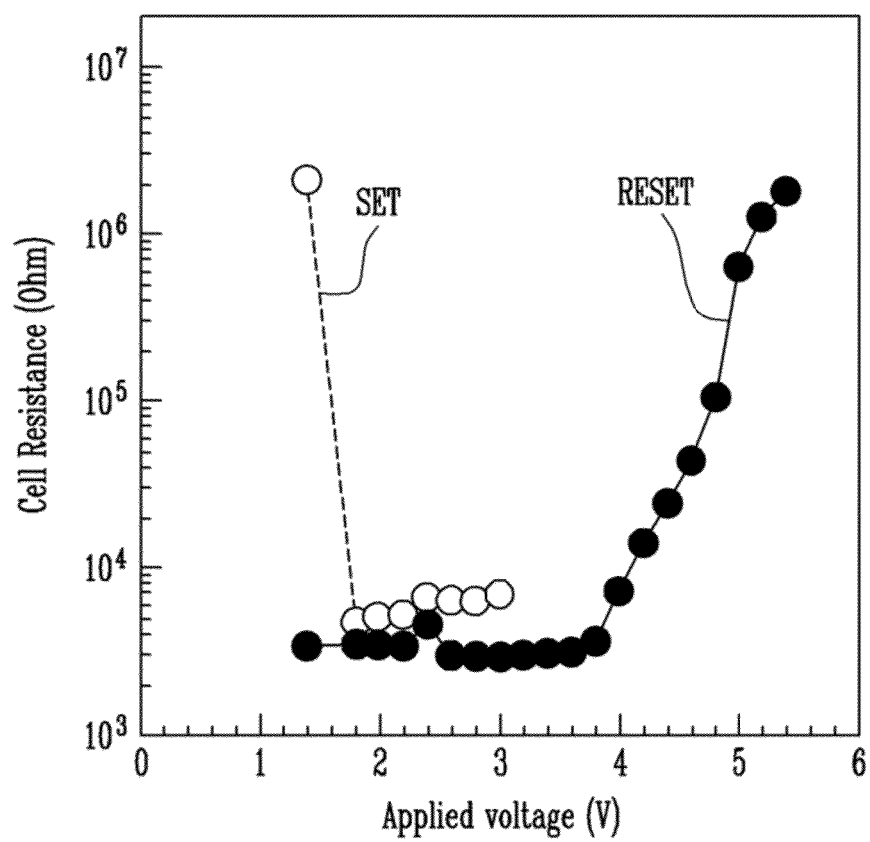
FIG. 7 is a graph of a device resistance relative to an applied voltage of a nonvolatile programmable switch device using a PRAM according to an exemplary embodiment of the present invention.

FIG. 7 is a graph of a device resistance relative to an applied voltage of a nonvolatile programmable switch device using a PRAM according to an exemplary embodiment of the present invention.

Referring to FIG. 7, it can be seen that when voltages of 4.8V and 1.8V are applied, the nonvolatile programmable switch device using the PRAM is properly changed to reset and set states, respectively. Also, when a programmed data state is read by using the proposed programmable switch device, an on/off switching margin can be obtained to be approximately 1000.

Meanwhile, the structure, material combination, and manufacture of the PRAM according to the present invention may be partially changed in order to improve its characteristics. The PRAM with the self-heating channel structure according to the present invention is not limited to the structure shown in FIG. 1 and can be variously changed.

That is, it will be understood that the above-described structure and manufacturing method of the PRAM are typical device structure and manufacturing method for effectively describing the PRAM according to the present invention in detail. Thus, the present invention may be embodied in different forms and should not be limited to the embodiments set forth herein.

A nonvolatile programmable switch device using a PRAM according to the present invention performs memory operations using resistive heating of a phase-change material without an additional heater electrode, thereby minimizing thermal loss due to thermal conductivity of a metal electrode to reduce power consumption of the switch device.

Also, since the present invention provides a structure in which a phase-change region of a phase-change material layer does not contact a metal electrode, formation of a device destruction mechanism can be prevented, thereby increasing the reliability of a memory operation.

In addition, a phase-change material layer can be finely patterned using relatively simple processes including lithography and etching processes so that a switch device having a self-heating channel structure can be easily embodied.

Furthermore, read and write operations can be performed using separate terminals connected by phase-change material patterns with different lengths, thereby increasing the reliability of a switch device having a PRAM.

The above-described embodiments of the present invention can be implemented not only as an apparatus and a method but also as a program for executing a function corresponding to the construction according to the embodiments of the present invention and a recording medium having the program embodied thereon. Also, the program and recording medium for accomplishing the present invention can be easily construed by programmers skilled in the art to which the present invention pertains.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A nonvolatile programmable switch device using a phase-change memory device, comprising:
    a substrate;
    a first metal electrode layer disposed on the substrate and including a plurality of terminals; and
    a phase-change material layer having a self-heating channel structure, the phase-change material layer having a plurality of introduction regions electrically contacting the terminals of the first metal electrode layer on the substrate and a channel region interposed between the introduction regions,
    wherein the terminals include first and second terminals, and
    wherein the channel region of the phase-change material layer comprises:
    a writing channel extending in a first direction and coupled to the first terminal, and
    a reading channel extending in a second direction perpendicular to the first direction and coupled to the second terminal, wherein the reading channel has a greater length than the writing channel and partially overlaps with the writing channel.

2. The switch device according to claim 1, wherein an area of the channel region of the phase-change material layer is smaller than that of each of the introduction regions.

3. The switch device according to claim 2, wherein an area ratio of the introduction regions to the channel region is 10 or more.

4. The switch device according to claim 1, wherein the first metal electrode layer comprises:
    a pair of write terminals connected by the writing channel and operating during a write operation; and
    a pair of read terminals connected by the reading channel and operating during a read operation.

5. The switch device according to claim 1, wherein the phase-change material layer is formed of a germanium (Ge)-antimony (Sb)-tellurium (Te) alloy (Ge2Sb2+xTe5), wherein an amount x of excess Sb added to the Ge2Sb2+xTe5 ranges from 0.12 to 0.32.

6. The switch device according to claim 1, the switch device further comprising:
    an insulating layer disposed on the first metal electrode layer and the phase-change material layer; and
    a via hole disposed on the first metal electrode layer and filled with a second metal electrode layer.

7. The switch device according to claim 1, wherein the writing channel and the reading channel of the channel region are in a cross shape.

* * * * *